(12) United States Patent
Honda (10) Patent No.: US 6,744,310 B2
(45) Date of Patent: Jun. 1, 2004

(54) POWER AMPLIFYING DEVICE (75) Inventor: Jun Honda, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/101,565

(22) Filed: Mar. 20, 2002

(65) Prior Publication Data

US 2002/0149424 A1 Oct. 17, 2002

(30) Foreign Application Priority Data

Mar. 21, 2001 (JP) ......................................... 2001-080812

(51) Int. Cl.$^7$ ............................. H03F 1/52; H03F 3/217
(52) U.S. Cl. ..................... 330/2; 330/207 A; 330/207 P
(58) Field of Search ............................... 330/2, 207 A, 330/207 P, 251, 298

(56) References Cited

U.S. PATENT DOCUMENTS

| 4,165,493 A | 8/1979 | Harrington ........... 330/207 P X |
| 4,186,437 A | 1/1980 | Cuk ..................... 303/65 |
| 4,439,741 A | 3/1984 | Turner, Jr. .................. 330/149 |
| 4,547,746 A * | 10/1985 | Erickson et al. ............ 330/298 |
| 4,727,874 A | 3/1988 | Bowers et al. ....... 330/207 A X |
| 5,196,808 A | 3/1993 | Pickett et al. ................ 330/298 |
| 5,334,945 A * | 8/1994 | Yokoya et al. ....... 330/207 P X |
| 5,532,649 A | 7/1996 | Sahyoun ...................... 330/297 |
| 5,719,526 A | 2/1998 | Fink .............................. 330/2 |

FOREIGN PATENT DOCUMENTS

EP  0 998 030 A1  5/2000

OTHER PUBLICATIONS

European Search Report dated Aug. 7, 2002. (for EP 02 25 1947).

* cited by examiner

Primary Examiner—Steven J. Mottola
(74) Attorney, Agent, or Firm—McGinn & Gibb, PLLC (57) ABSTRACT

A power amplifying device promptly detects an abnormal condition of a load and permits protection of an output without causing power loss. A test signal having a predetermined frequency and signal level is supplied to an amplifier, and the output level is measured. The measured level is compared with the output level that is projected when the test signal is supplied with an appropriate load connected to the amplifier so as to detect a load condition. If a determination result indicates that the load is short-circuited or released, then the operation of the amplifier is promptly interrupted.

10 Claims, 6 Drawing Sheets

POWER AMPLIFYING DEVICE

BACKGROUND OF THE INVENTION

1. Field of the Invention

The present invention relates to a power amplifying device.

2. Description of the Related Art

An amplifier used for amplifying electrical power supplies a high electrical power to a load at a relatively low output impedance. Hence, it is necessary to ensure that the impedance of the load to which the amplifier is connected is within a specified range. If the load is short-circuited, the impedance of the load is reduced to zero, and a large current flows into a power amplifying element during an amplifier output stage, leading to a failure of the power amplifying element used in the amplifier output stage. For this reason, when an amplifier is used to amplify electrical power, there is a required to always check the condition of the load connected to the amplifier, and to immediately interrupt the amplifying operation of the amplifier to protect an amplifier output stage circuit, if the impedance value of the load deviates from a predetermined range.

A conventional amplifier for amplifying electric power detects a load condition as described below. First, a detection resistor having a small resistance value is connected in series with the load to measure a voltage drop observed on the detection resistor due to load current. Thus, changes in the load current are detected so as to detect load conditions from the changes.

In other words, the load conditions cannot be detected unless the load current passes through the detection resistor. More specifically, an abnormal load condition cannot be detected unless an amplifying operation is actually performed under an abnormal load condition. Furthermore, since the detection resistor is connected in series with a load, a power loss inevitably results by the load current passing through the detection resistor. In addition, a large resistance element must be used as the detection resistor because of a heat generation problem caused by such power loss. This adversely affects efforts to provide smaller amplifiers.

Recently, in response to the demands for reduced sizes and higher efficiency of amplifiers, amplifiers using the "class D amplifying method" are becoming more popular.

According to the class D amplifying method, a input analog signal is first subjected to processing for modulation, such as pulse width modulation (PWM) or the pulse density modulation (PDM). Then, a signal that has been converted into a digital signal by the modulation is amplified. Thereafter, the amplified signal is passed through a low-pass filter to convert it back into an analog signal. A class D amplifier is able to amplify an analog signal simply by amplifying a digital signal (signal ON/OFF processing). Theoretically, therefore, 100% power efficiency can be obtained. This makes it possible to reduce the size of the amplifier by taking full advantage of the high efficiency.

Thus, the power loss attributable to the detection resistor mentioned above and the need for using large components because of the heat generation problem conflict with the advantages obtained by class D amplifiers. There is also a problem with the conventional method for detecting a load condition since an abnormal load current cannot be detected unless the load actually develops an anomaly.

A class D amplifier has a low-pass filter in its output section. When the amplifier is not under a load, a signal current will only pass the low-pass filter of the output section. In general, a filter of the output section is constituted by an LC low-pass filter, and therefore has a predetermined resonance frequency. For this reason, if a signal input to the class D amplifier includes such a resonance frequency, a resonance phenomenon occurs when the amplifier is not under a load. This causes a significant drop in the impedance of the output section of the class D amplifier, allowing a large current to flow, which may possibly lead to a failure of the class D amplifier. There has been a problem with the conventional method for detecting a load condition by using a detection resistor in that it is difficult to detect a no-load condition of the amplifier.

OBJECTS AND SUMMARY OF THE INVENTION

Accordingly, the present invention was developed with a view toward solving the problems described above. It is an object of the present invention to provide a power amplifying device that permits an abnormal load condition to be quickly detected so as to protect an amplifier output, and minimize power loss.

To this end, according to one aspect of the present invention, there is provided a power amplifying device which includes a power amplifying circuit and to which a load having a predetermined impedance is connected, including a test signal generating part that generates a test signal having a predetermined frequency, a signal level measuring part that measures a signal level of the test signal that has passed through a filtering circuit provided in an output part of the electric power amplifying device, a signal level comparing part that compares a measurement result supplied by the signal level measuring part with a predetermined reference signal level, and a control part that detects a condition of the load connected to the power amplifying device on the basis of a comparison result supplied by the signal level comparing part, and provides protective measures for the power amplifying device according to a result of the detection.

DETAILED DESCRIPTION OF THE PREFERRED EMBODIMENTS

Figure 1:
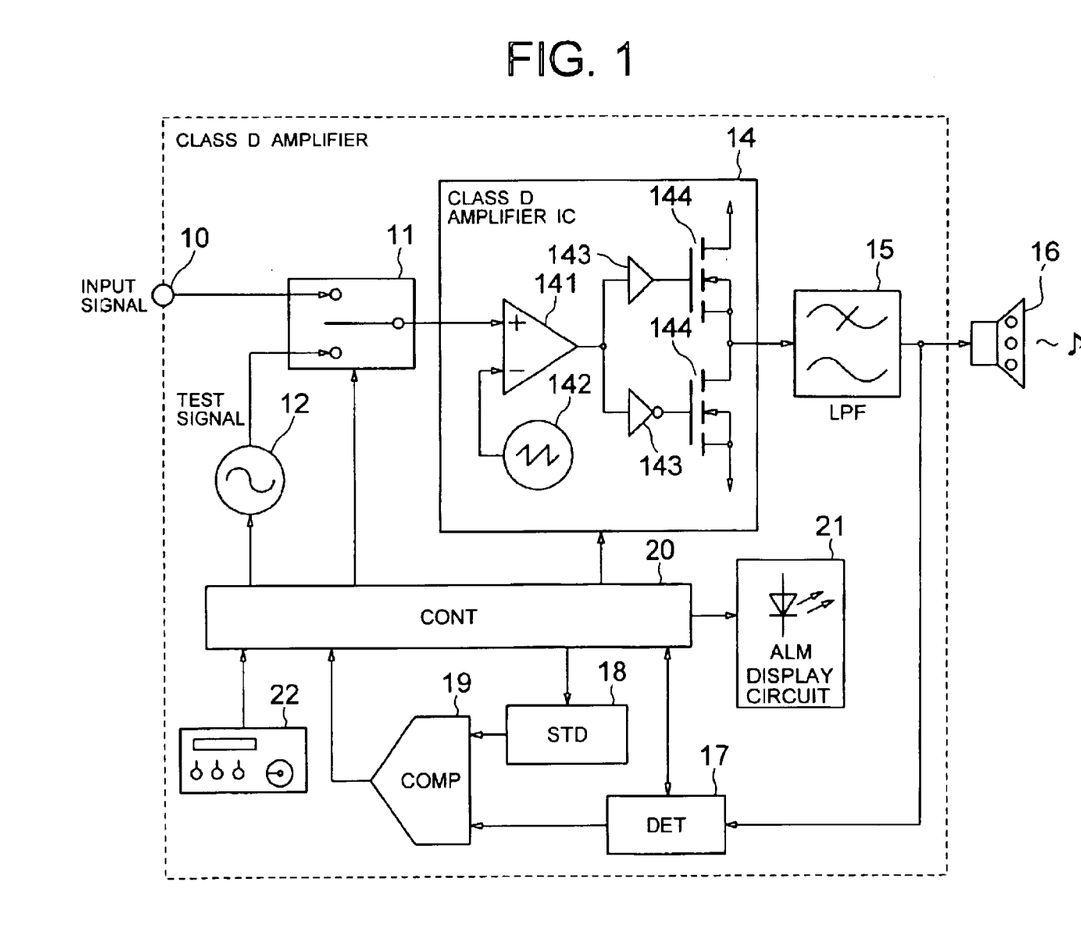
FIG. 1 is a block diagram showing a configuration of a class D amplifier provided with a protective function that is an embodiment of the present invention.

FIG. 1 is a block diagram showing the configuration of a class D amplifier in accordance with the present invention. Normally, a speaker 16 is connected to the class D amplifier as a load.

Referring to FIG. 1, a signal switching circuit 11 comprises an analog switch using, for example, an FET, a transistor, or a mercury relay. The signal switching circuit 11 switches between an input signal and a test signal in response to an input switching signal received from a control circuit 20, and connects the selected signal to an input section of a class D amplifier IC 14, comprising a power amplifier circuit. The input signal is received from audio equipment, such as a tuner or a CD player, through a signal input terminal 10. The test signal is supplied from a test signal generating circuit 12.

The test signal generating circuit 12 is an oscillating circuit that generates test signals used to detect load conditions of the class D amplifier. The circuit comprises a PLL synthesizer having, for example, a quartz resonator or a ceramic resonator as an oscillating source, and is capable of generating arbitrary frequencies. The frequencies to be generated may be controlled by control signals supplied from the control circuit 20.

The class D amplifier IC 14 primarily includes a comparator circuit 141, a triangular wave oscillation circuit 142, an output-stage driver circuit 143, and an output-stage circuit 144.

The comparator circuit 141 compares a signal received through the intermediary of the signal switching circuit 11 with a triangle wave from the triangle wave oscillation circuit 142, converts the magnitude relationship between the two signals into a binary signal, and outputs the binary signal. Thus, the amplitude information regarding input signals is converted into a change in the pulse width of a binary signal. In other words, such processing generates a signal by subjecting input signals to PWM modulation.

The output-stage driver circuit 143 converts the PWM signal into two signals having phases that are inverted from each other. These two signals are used to drive the gate of the output-stage circuit 144. The output-stage circuit 144 comprises a power switching circuit formed by, for example, a MOS-FET.

A low-pass filter 15 suppresses harmonic components contained in an output signal of the class D amplifier IC 14 to extract and reproduce a frequency component and an amplitude component of the input signal. As mentioned above, such a filter is generally includes an LC filter having a small power loss.

The speaker 16 converts electrical signals from the low-pass filter 15 into acoustic signals and outputs the acoustic signals.

A test signal measuring circuit 17 comprises, for example, a buffer amplifier having a high input impedance and an A/D converter. The test signal measuring circuit 17 extracts an output signal from the low-pass filter 15 without influencing output of the filter, and measures the signal level of the output signal.

A reference signal level setting circuit 18 stores a predetermined reference signal level. A signal level comparator circuit 19 compares a signal level measured value from the test signal measuring circuit 17 with a reference signal level of the reference signal level setting circuit 18. The signal level comparator circuit 19 supplies a result of the comparison to the control circuit 20.

The control circuit 20 is primarily a microcomputer (hereinafter referred to as "the $\mu$CPU") that controls the operation of the entire class D amplifier circuit shown in FIG. 1. The control circuit 20 includes memory devices, such as a read only memory (ROM) and a random access memory (RAM). The ROM stores a main program and various types of subroutine programs for the operation of the circuit. The $\mu$CPU executes the programs in synchronization with built-in clocks. The RAM temporarily saves diverse types of processing results during the operation of the circuit and a variety of types of flag registers providing guidelines for making decisions in processing.

An alarm display circuit 21 notifies a user of an anomaly of a load connected to the low-pass filter 15. Such anomaly may be a short circuit, release, etc. of the load. The alarm display circuit 21 may comprise, for example, an LED or a liquid crystal display device and a driving circuit therefor.

An operation input circuit 22 operates the class D amplifier shown in FIG. 1. The operation input circuit 22 has a console panel including a ten-digit keypad and various function keys, and a circuit for interfacing with the control circuit 20. When a user wishes to detect the condition of a load connected to the class D amplifier, the user enters predetermined commands to the circuit to carry out the processing for the detection.

Generally, the frequency characteristic of an LC low-pass filter, in the region of a cutoff frequency fc is disturbed unless the input/output impedances are matched. The frequency characteristic, therefore, will be as shown in FIG. 2 when the impedance of the load connected to the low-pass filter 15 changes.

Figure 2:
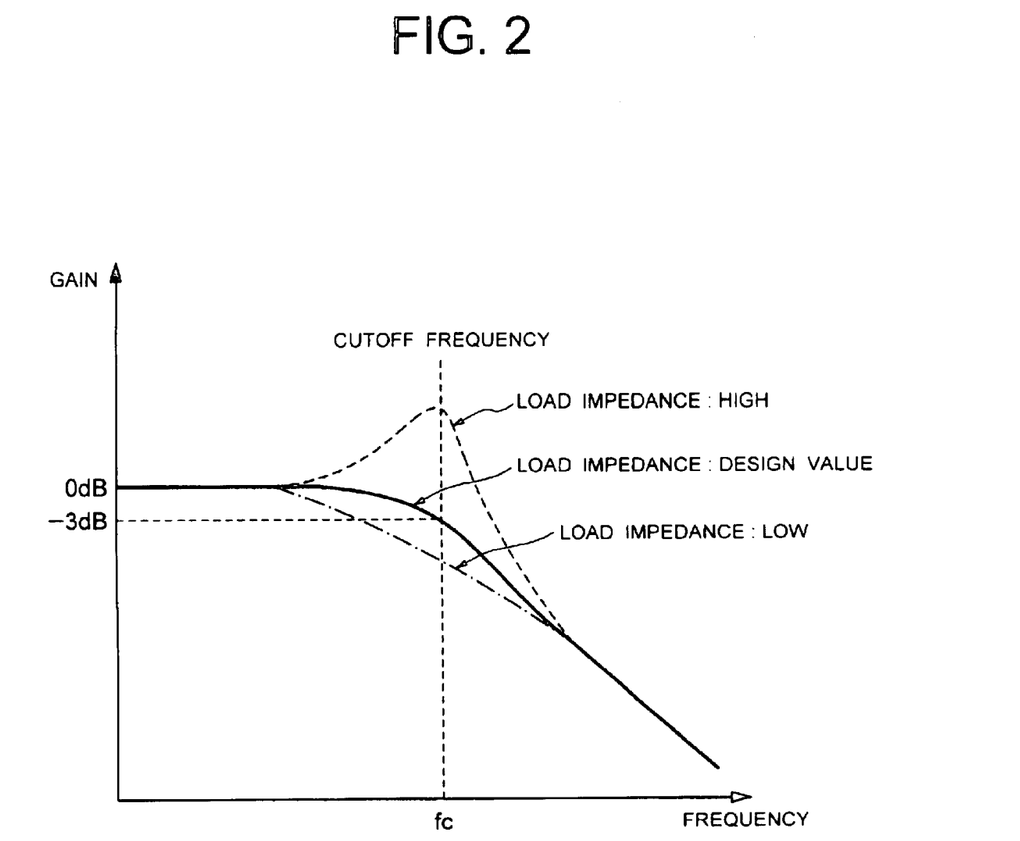
FIG. 2 is an explanatory diagram showing changes in the frequency characteristic observed when the value of the load impedance is changed in the device shown in FIG. 1.

As is obvious from FIG. 2, in the region of the cutoff frequency fc of the filter, as the impedance of the load increases over a design value, that is, as the load approaches a released condition, the gain in the frequency characteristic increases. Conversely, as the impedance of the load decreases, that is, as the load approaches a short-circuited condition, the gain in the frequency characteristic decreases. In this embodiment, the class D amplifier is protected by making use of the changes in the frequency characteristic caused by the variations in the load impedance.

The function for detecting load conditions and the function for protecting the amplifier in the circuit of FIG. 1 will now be described with reference to the processing flowchart shown in FIG. 3.

Figure 3:
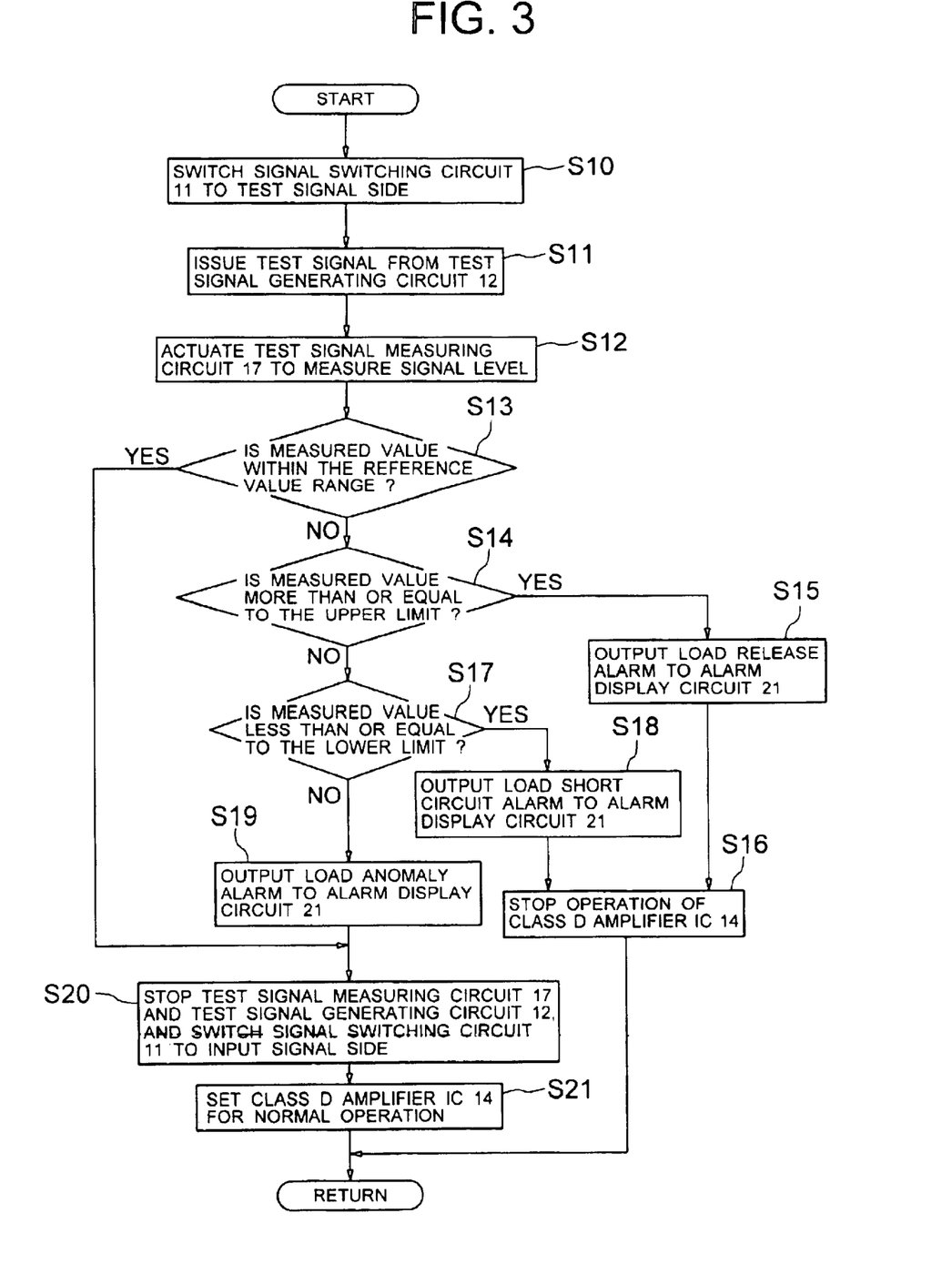
FIG. 3 is a flowchart showing the processing for detecting a load condition and the processing for protecting an amplifier in the device shown in FIG. 1.

The processing illustrated by the flowchart of FIG. 3 may be arranged so that it is started at an "initial setting operation" time at which the power of the class D amplifier shown in FIG. 1 is turned ON. Alternatively, the processing may be arranged so that it is manually started by a user at any time through the operation input circuit 22.

When the processing shown in FIG. 3 is started, the control circuit 20 first supplies an input switching signal to the signal switching circuit 11 to switch the input of the class D amplifier IC 14 to the test signal generating circuit 12 (step 10). Then, the control circuit 20 supplies a predetermined control signal to the test signal generating circuit 12. Based on the received control signal, the test signal generating circuit 12 generates a test signal that has a predetermined frequency and a predetermined signal level (step 11). The test signal is applied to the input part of the class D amplifier IC 14 through the intermediary of the signal switching circuit 11. The test signal is then converted into a PWM signal in the class D amplifier IC 14 to undergo power amplification in a pulse waveform. An output signal from the class D amplifier IC 14 passes through the low-pass filter 15 so as to remove higher harmonics superimposed on the signal, before the output signal is supplied to the speaker 16, which is the load of the low-pass filter 15.

Setting the signal level of the test signal supplied to the class D amplifier IC 14 at an extremely low signal level will hold the signal level at the output end of the amplifier IC 14 at a low value. This will prevent abnormal current from passing the output stage of the class D amplifier IC 14 even if the load is in an abnormal condition when the test signal is supplied.

In the embodiment shown in FIG. 1, a frequency in the region of 44 kHz, which is the cutoff frequency of the low-pass filter 15, is used as the frequency of the test signal. As mentioned above, in the LC low-pass filter, the greatest change in the frequency characteristic is caused by a change in a load impedance at a frequency near the cutoff frequency. At frequencies other than the frequencies around the cutoff frequency, there is less disturbance in the frequency characteristic attributable to a change in the impedance. For this reason, the test signal of the frequency mentioned above (in the region of 44 kHz) is used in this embodiment.

The upper limit of human audible frequency is generally known to be in the vicinity of 20 kHz. Hence, it is unlikely that the test signal output as an acoustic signal from the speaker 16 will be audible to users.

If a low-pass filter having a cutoff frequency that is lower than the aforesaid frequency (in the region of 44 kHz) is used for the output of a class D amplifier, then it is necessary to use a frequency in an audible range as the test signal frequency. In this case, the test signal will be leaked out as an audible sound from the speaker 16. However, the processing shown in FIG. 3 is carried out when the power is turned ON or a user decides to conduct a test for detecting a load condition. This means that processing based on the test signal is started while no signal is being supplied from audio equipment to the class D amplifier. Hence, the operation will not provoke any remarkable uncomfortableness of a user.

The control circuit 20 drives the test signal generating circuit 12 in step 11 to generate the test signal and to actuate the test signal measuring circuit 17 in synchronization with the test signal. Then, the test signal measuring circuit 17 measures the output level of the test signal supplied from the low-pass filter 15 to the speaker 16 (step 12). The measured value of the test signal level is compared by the signal level comparator circuit 19 with diverse reference signal levels set in the reference signal level setting circuit 18 (steps 13 through 17).

In step 13, it is first determined whether the measured level of the test signal lies within a permissible range with respect to the reference signal level. The reference signal level here refers to the signal level appearing at the output end of the low-pass filter 15 when a rated load impedance is connected to the low-pass filter 15. The rated load impedance in this case refers to a designed load impedance. For the reference signal level, a value determined by computation may be stored beforehand in the ROM of the control circuit 20, and the stored value may be loaded into the reference signal level setting circuit 18, when the comparing operation is performed by the signal level comparator circuit 19.

It is assumed that the input level of the test signal supplied to the class D amplifier IC 14, and the amplification factor of the class D amplifier IC 14 are fixed. Then, it is also assumed that the impedance of the load connected to the output end of the low-pass filter 15 is greater than a design value. As is obvious from FIG. 2, in the vicinity of the cutoff frequency fc at this time, the signal level appearing at the output end of the low-pass filter 15 is higher than when the rated load is connected thereto.

Conversely, as the value of the load impedance decreases to less than the design value, the signal level around fc decreases, as shown in FIG. 2 mentioned above.

More specifically, the condition of the load can be detected by measuring the level of the test signal at the output end of the low-pass filter 15, and comparing the measured level with the signal level obtained when an appropriate load is connected thereto.

If it is determined in step 13 that the measured level of the test signal is within the permissible range of the reference signal level, then it is presumed that a load of an appropriate impedance has been connected to the output end of the low-pass filter 15. The control circuit 20 proceeds to step 20 to carry out the processing applied to a case where the load is normal. Then, the control circuit 20 stops the operations of the test signal measuring circuit 17 and the test signal generating circuit 12. The control circuit 20 also switches the signal switching circuit 11 to the input terminal 10, then causes the class D amplifier IC 14 to start a normal amplifying operation. This terminates the processing illustrated by the flowchart shown in FIG. 3 (step 21).

If it is determined in step 13 that the measured level is not within the permissible range of the reference signal level, then the signal level comparator circuit 19 determines whether the measured level has reached an upper limit range of the signal level (step 14). The upper limit range in this case refers-to the level range within which an output level may rise if a load is released or in a condition close to release of the load. If an output level increases to the upper limit range, then the signal level comparator circuit 19 decides that the load has been released or is in a condition close to release, and notifies the control circuit 20 to that effect. Upon receipt of the notification, the control circuit 20 issues an instruction for displaying the release of the load to the alarm display circuit 21 (step 15). Then, the control circuit 20 promptly stops the operation of the class D amplifier IC 14 (step 16) and terminates the processing shown in FIG. 3.

If it is determined in step 14 that the measured level has not reached the upper limit range, then the signal level comparator circuit 19 determines whether the measured level has decreased to a lower limit range of the signal level (step 17). The lower limit range in this case refers to the level range within which an output level may decreases if a load is short-circuited or in a condition close to a short circuit. If a measurement level decreases to the lower limit range, then the signal level comparator circuit 19 decides that the load has been short-circuited or in a condition close to a short circuit, and notifies the control circuit 20 to that effect. Upon receipt of the notification, the control circuit 20 issues an instruction for displaying the short circuit of the load to the alarm display circuit 21 (step 18). Then, the control circuit 20 promptly stops the operation of the class D amplifier IC 14 according to the processing of step 16 mentioned above and terminates the processing shown by the flowchart of FIG. 3.

If it is determined in step 17 that the measured level has not decreased to the lower limit range, this condition means following. The measured level of the test signal is not within the permissible range, meaning that an appropriate load impedance has not been connected, but the output end of the low-pass filter 15 has not yet reached a condition at which the load has been released or short-circuited. In this case, the control circuit 20 carries out processing as shown in the flowchart of FIG. 3 so as to leave an action to be taken up to a decision made by a user. Upon receipt of such a determination result from the signal level comparator circuit 19, the control circuit 20 issues, in step 19, an instruction to indicate a load anomaly to the alarm display circuit 21. Thereafter, the control circuit 20 implements the processing from step 20 and step 21 mentioned above to start the normal amplifying operation of the class D amplifier IC 14.

To improve reliability, the processing for measuring the signal level and the processing for determining a measured value shown in FIG. 3 may be repeatedly carried out for a predetermined number of times at short time intervals. In this case, an arrangement may be made so that if any load anomalies should be detected while the detection processing is being repeatedly implemented, then it is decided that the load has developed an abnormal condition, and the user is alerted to stop the amplifying operation. Alternatively, it may be arranged so that, if an anomaly is detected only once, then only an alarm is displayed, and the amplifying operation is not interrupted until the anomaly is detected for at least a predetermined number of times.

Figure 4:
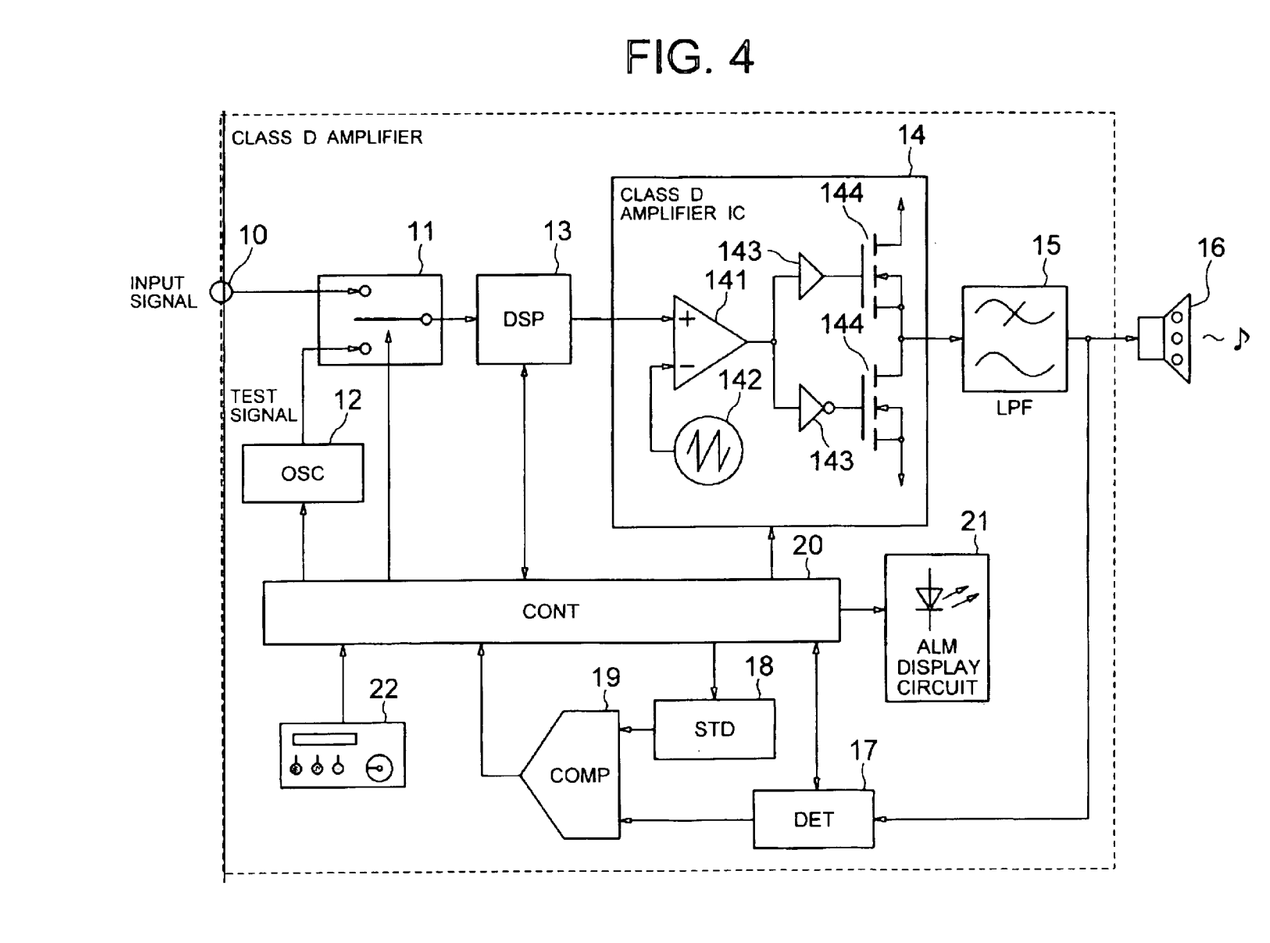
FIG. 4 is a block diagram showing the configuration of a class D amplifier equipped with a protective function in accordance with a second embodiment of the present invention.

The class D amplifier with a protective function in accordance with the present invention may have the configuration shown by the block diagram of FIG. 4. The block diagram of FIG. 4 shows a digital signal processing circuit 13 that uses a digital signal processor (hereinafter referred to simply as the "DSP") in the front stage of the class D amplifier IC 14. The digital signal processing circuit 13 directly receives digital signals from digital audio equipment, such as an MD player or a digital tuner, connected to the front stage of the amplifier.

Accordingly, in the embodiment shown in FIG. 4, a test signal from the test signal generating circuit 12 is supplied as a digital signal to the signal switching circuit 11. Furthermore, adopting the configuration shown in FIG. 4 makes it possible to receive control signals for the music to be played, which are input signals, from the digital audio equipment connected to the front stage. The control signals in this case refer to the signals of information regarding the start, end, intervals, etc. of the music to be played. The control signals enable the control circuit 20 to detect a timing at which no such input signals of music or the like are applied to the class D amplifier. At this timing, the control circuit 20 may start the processing shown in FIG. 3 to detect the condition of a load connected to the class D amplifier.

The digital signal processing circuit 13 includes a D/A converter at its output end because the signals to be supplied to the class D amplifier IC 14 must be turned into analog signals. Forming the outputs from the digital signal processing circuit 13 into PWM signals makes it possible to directly drive the output-stage driver circuit 143 by using the PWM output signals.

Figure 5:
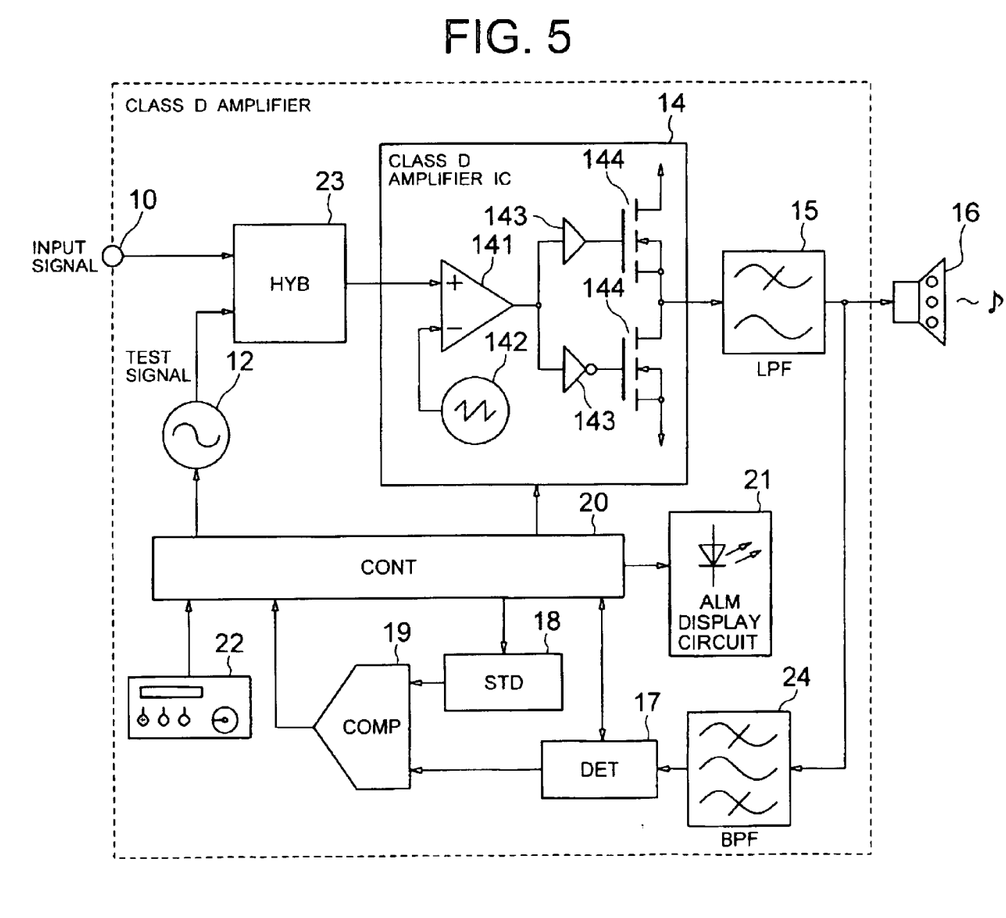
FIG. 5 is a block diagram showing the configuration of a class D amplifier equipped with a protective function in accordance with a third embodiment of the present invention.

The block diagram of FIG. 5 illustrates a class D amplifier equipped with a protective function according to another embodiment of the present invention. The class D amplifier shown in FIG. 5 uses a signal superimposing circuit 23 in place of the signal switching circuit 11 shown in FIG. 1. The signal superimposing circuit 23 in this embodiment comprises, for example, an adding circuit and a signal hybrid circuit. In the embodiment shown in FIG. 5, a test signal from a test signal generating circuit 12 is superimposed on an input signal from an input terminal 10, and the resulting signal is supplied to the input part of a class D amplifier IC 14. The embodiment is configured such that only a test signal is extracted through a band pass filter 24 for extracting a test signal, that is located at the output end of a low-pass filter 15, and the extracted test signal is supplied to a test signal measuring circuit 17.

The test signal extracting filter 24 may be constructed of an active filter having a high input impedance so as to minimize the influences of the low-pass filter 15 on outputs. Alternatively, the test signal extracting filter 24 may be constructed of a DSP having a high input impedance. In this case, the filtering for extracting the test signal will be digitally effected and measured values input to the test signal measuring circuit 17 is also supplied in the form of digital signals.

In the embodiment shown in FIG. 5, it is required to securely separate the test signal from input signals of music or the like by using the test signal extracting filter 24 when taking out the test signal. For this purpose, it is necessary to set the cutoff frequency of the low-pass filter 15 at a level higher than that in a band wherein the input signals for music or the like exist. It is preferred to set the frequency of a test signal at the cutoff frequency of the low-pass filter 15 or at a frequency in the vicinity thereof. This setting causes the test signal to have a frequency that is higher than the band wherein the input signals of music or the like are present, that is, higher than a human audible frequency band. Thus, it is possible to constantly check a load condition without causing a user to notice a test signal sound leaking out of a speaker 16. This leads to dramatically improved reliability of the amplifier.

Figure 6:
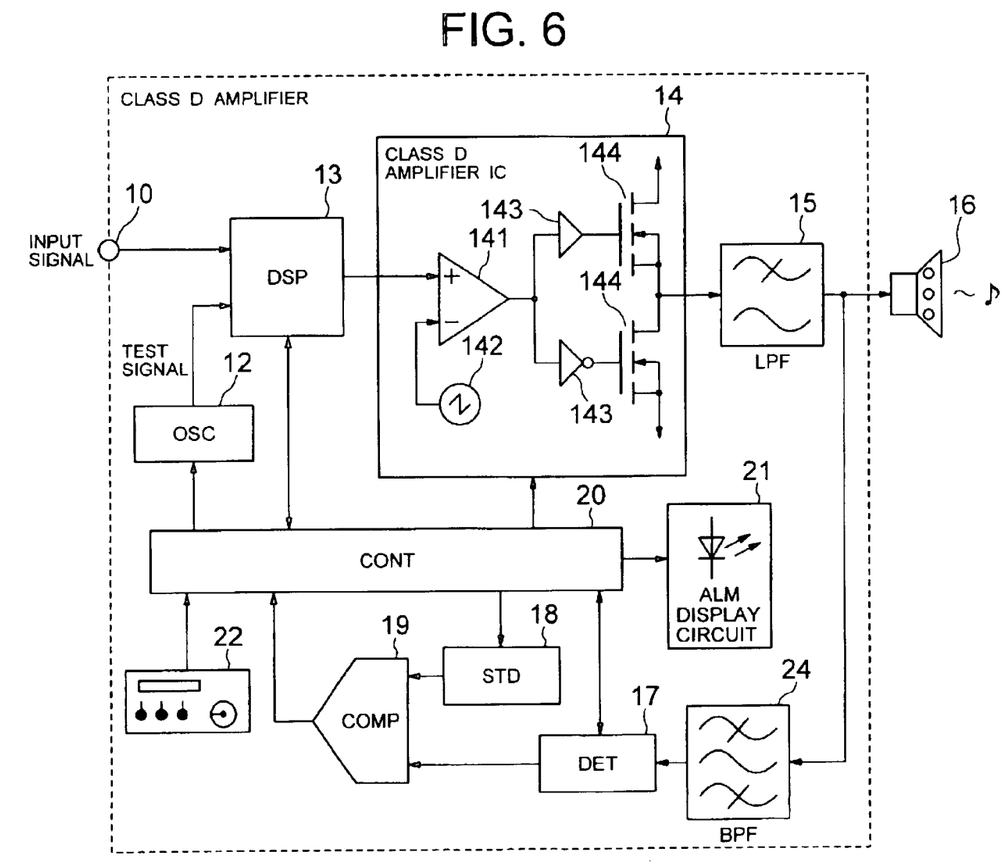
FIG. 6 is a block diagram showing the configuration of a class D amplifier equipped with a protective function in accordance with a fourth embodiment of the present invention.

As shown in FIG. 6, the input part of the class D amplifier of FIG. 5 may be formed of a digital signal processing circuit 13 using the DSP shown in FIG. 4. This makes it possible to start the operation for checking a load by using control signals from digital audio equipment connected to the front stage of the class D amplifier, as explained in conjunction with FIG. 4.

When the configuration shown in FIG. 6 is adopted, the same interface as explained in conjunction with FIG. 4 will be used for the interface between the digital signal processing circuit 13 and the class D amplifier IC 14.

A band width of the input signals after conversion is restricted to within a band width that is half a sampling frequency or less regardless of whether the A/D conversion on the input signals of music or the like is effected inside or outside the class D amplifier, as is obvious from the sampling theorem.

Accordingly, as shown in FIG. 5 or FIG. 6, when a test signal is superimposed on the input signals of music or the like, the cutoff frequency of the low-pass filter 15 is set at a frequency higher than the frequency that is half the sampling frequency of the input signals, and the frequency of the test signal is set at or near the cutoff frequency. Under this setting condition, only the test signal can be securely extracted without being influenced by the input signals. Moreover, the condition of a load can be constantly monitored, permitting further reliable protection of an amplifier.

The present invention is not limited to the embodiments described above. The present invention may alternatively be embodied by a one-chip LSI that includes such constituents as the control circuit 20, the signal level comparator circuit 19, and the digital signal processing circuit 13. In this case, a $\mu$CPU included in the LSI may carry out the operation processing explained above merely by using software according to programs also included in the LSI.

In the embodiments set forth above, the class D amplifier has only a single channel; however, the present invention is not limited thereto. For instance, the embodiments may alternatively use a class D amplifier having a stereo channel or more multiple channels for signal amplification.

Furthermore, as shown in FIG. 4 or FIG. 6, providing the input part of the class D amplifier IC 14 with the digital signal processing circuit 13 makes it possible to carry out various types of digital signal processing on the input signals. For example, an arrangement may be made such that digital filtering for suppressing only a particular frequency component (e.g., a resonance frequency component of the low-pass filter 15) contained in the input signals may be carried out on the input signals, when the release of a load is detected. This allows the class D amplifier IC 14 to be protected when the load is released.

The interruption of the operation of the class D amplifier IC 14 that is effected when an abnormal condition of a load is detected, as described in the above embodiments, is not limited to a forcible interruption of the amplifying operation of the class D amplifier IC 14. The interruption of the operation includes, for example, the processing for restricting the supply of input signals to the class D amplifier IC 14. In other words, the term "the interruption of the operation" generically refers to any processing that restrains the supply of current to an output stage of the class D amplifier IC 14.

Substantially as described above, the present invention provides a configuration that permits the load condition of an amplifier to be detected by measuring the output level of a class D amplifier by using a low-level test signal. With this arrangement, it is possible to protect the amplifier against overcurrent caused by an abnormal load condition.

Moreover, the present invention obviates the need for a large power resistance element for measuring load current. This prevents wasteful power loss and accordingly prevents heat generation resulting from the power loss, thus contributing to a reduction in size and increased integration scale of an amplifier.

It is understood that the foregoing description and accompanying drawings set forth the preferred embodiments of the invention at the present time. Various modifications, additions and alternative designs will, of source, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-80812 which is hereby incorporated by reference.

What is claimed is:

1. A power amplifying device to which a load having a predetermined impedance is connected, comprising:

a power amplifying circuit;

a test signal generating circuit that generates a test signal having a predetermined frequency;

a signal level measuring circuit that measures a signal level of the test signal that has passed through a filtering circuit provided in an output circuit of the power amplifying device;

a signal level comparing circuit that compares a measurement result supplied by the signal level measuring circuit with a predetermined reference signal level; and a control circuit that detects a condition of the load connected to the electric power amplifying device on the basis of a comparison result supplied by the signal level comparing circuit, and effects protection of the electric power amplifying device in accordance with a detection result of the control circuit.

2. The power amplifying device according to claim 1, wherein the power amplifying circuit comprises a power amplifying circuit that effects class D power amplification.

3. The power amplifying device according to claim 1, wherein the frequency of the test signal generated by the test signal generating circuit is approximately a cutoff frequency of the filtering circuit.

4. A power amplifying device to which a load having a predetermined impedance is connected, comprising:

a power amplifying circuit;

a test signal generating circuit that generates a test signal having a predetermined frequency;

a signal level measuring circuit that measures a signal level of the test signal that has passed through an LC filtering circuit provided in an output circuit of the power amplifying device;

a signal level comparing circuit that compares a measurement result supplied by the signal level measuring circuit with a predetermined reference signal level; and a control circuit that detects a condition of the load connected to the electric power amplifying device on the basis of a comparison result supplied by the signal level comparing circuit, and effects control to suppress a frequency component in an input signal supplied to the LC filtering circuit at which the LC filtering circuit resonates in accordance with a detection result of the control circuit.

5. The power amplifying device according to claim 4, wherein the power amplifying circuit comprises a power amplifying circuit that effects class D power amplification.

6. The power amplifying device according to claim 4, wherein the frequency of the test signal generated by the test signal generating part is approximately a cutoff frequency of the LC filtering circuit.

7. An amplifier protection circuit, comprising:

an LC filter connected to an output of an amplifier, to which amplifier output a predetermined load is presumed to be attached a test generator providing a test signal to be an input signal into said amplifier, a frequency of said test signal tuned to be at approximately a cutoff frequency of said LC filter; and a detector for measuring a result of said test signal at said amplifier output.

8. An amplifier comprising:

an amplifier protection circuit, said amplifier protection circuit further comprising:

an LC filter connected to an output of said amplifier, to which amplifier output a predetermined load is presumed to be attached a test generator providing a test signal to be an input signal into said amplifier, a frequency of said test signal tuned to be approximately a cutoff frequency of said LC filter; and a detector for measuring a result of said test signal at said amplifier output.

9. The amplifier of claim 8, further comprising:

a test switch to allow said amplifier to amplify a selected one of a normal input signal and said test signal.

10. A method of protecting an amplifier receiving a signal to be amplified, said amplifier presumed to be connected to a load having a predetermined range of values, said method comprising:

providing an LC filter to an output of said amplifier, said LC filter having a cutoff frequency $F_c$;

providing a test signal as a test signal input into said amplifier, said test signal tuned to approximately said cutoff frequency $F_c$; and providing a test detector to said output of said amplifier, said test detector measuring a result of a test signal, said test detector determining whether an out-of-bounds condition exists and providing an output signal to achieve at least one of an action to terminate an operation of said amplifier and an indication of an out-of-bounds condition.

* * * * *